United States Patent
Mori et al.

(10) Patent No.: US 7,569,929 B2
(45) Date of Patent: Aug. 4, 2009

(54) SEMICONDUCTOR DEVICE

(75) Inventors: Shogo Mori, Kariya (JP); Keiji Toh, Kariya (JP); Shinobu Tamura, Oyama (JP); Shinobu Yamauchi, Oyama (JP)

(73) Assignees: Kabushiki Kaisha Toyota Jidoshokki, Kariya-shi (JP); Showa Denko K.K., Tokyo (JP)

( * ) Notice: Subject to any disclaimer, the term of this patent is extended or adjusted under 35 U.S.C. 154(b) by 0 days.

(21) Appl. No.: 12/154,170

(22) Filed: May 21, 2008

(65) Prior Publication Data

US 2008/0290498 A1 Nov. 27, 2008

(30) Foreign Application Priority Data

May 25, 2007 (JP) .............................. 2007-139031

(51) Int. Cl.
*H01L 23/34* (2006.01)
(52) U.S. Cl. .............................. 257/706; 257/E23.082
(58) Field of Classification Search ......... 257/706–712, 257/E23.082, 717–722
See application file for complete search history.

(56) References Cited

U.S. PATENT DOCUMENTS

| | | | |
|---|---|---|---|
| 6,261,404 B1 | 7/2001 | Baska et al. | |
| 6,512,674 B1 | 1/2003 | Tozawa | |
| 7,180,176 B2 * | 2/2007 | Endou et al. | 257/712 |
| 7,345,885 B2 * | 3/2008 | Boudreaux et al. | 361/721 |
| 2008/0128896 A1 * | 6/2008 | Toh et al. | 257/712 |
| 2008/0290500 A1 * | 11/2008 | Iwata et al. | 257/712 |

FOREIGN PATENT DOCUMENTS

| | | |
|---|---|---|
| EP | 1 873 827 A1 | 1/2008 |
| EP | 1 901 350 A1 | 3/2008 |
| JP | 2004-153075 | 5/2004 |
| JP | 2006-294699 | 10/2006 |

OTHER PUBLICATIONS

European Search Report dated Oct. 7, 2008 issued by European Patent Office for application No. 08156824.8-1235.

* cited by examiner

*Primary Examiner*—Nathan W Ha
(74) *Attorney, Agent, or Firm*—Locke Lord Bissell & Liddell LLP

(57) ABSTRACT

A semiconductor device is disclosed that includes a circuit board, a semiconductor element, a heat sink, and a stress relaxation member. The circuit board includes an insulated substrate, a metal circuit joined to one side of the insulated substrate, and a metal plate joined to the other side of the insulated substrate. The semiconductor element is joined to the metal circuit. The heat sink radiates heat generated in the semiconductor element. The stress relaxation member thermally joins the heat sink to the metal plate. The stress relaxation member is formed of a material having a high thermal conductivity. The stress relaxation member includes recesses, which curve inward from the peripheral portion of the stress relaxation member, to form stress relaxation spaces at the peripheral portion of the stress relaxation member.

7 Claims, 3 Drawing Sheets

SEMICONDUCTOR DEVICE

BACKGROUND OF THE INVENTION

The present invention relates to a semiconductor device provided with a circuit board that includes an insulated substrate on both sides of which are joined a first metal plate and a second metal plate, a semiconductor element joined to the first metal plate, and a heat radiating device thermally joined to the second metal plate via a junction member.

In general, a circuit board of a power module, which is a semiconductor device, includes an insulated substrate formed of aluminum nitride. First and second metal plates are respectively joined to both sides of the insulated substrate. A semiconductor element is thermally joined to the first metal plate, and a heat radiating device is thermally joined to the second metal plate. The heat radiating device radiates heat generated by the semiconductor element. The heat radiating device in such a power module is required to maintain heat radiating performance for an extended period of time. However, depending on the use conditions of the power module, thermal stress is generated in the heat radiating device by the difference in coefficient of linear expansion between the insulated substrate and the heat radiating device. As a result, cracks may occur in the insulated substrate or at junction portions between the insulated substrate and the heat radiating device, and a warp may be generated at the junction section of the heat radiating device joined to the insulated substrate.

Japanese Laid-Open Patent Publication No. 2004-153075discloses a power module that solves such a problem. The power module of the publication includes an insulated substrate, a radiator, and a heat sink. A heating element (semiconductor element) is mounted on one side of the insulated substrate and the radiator is soldered to the other side of the insulated substrate. The heat sink is fastened to the radiator with screws. The radiator includes a pair of plate-like radiator main bodies formed of a material having a high thermal conductivity such as aluminum and copper and a low thermal expansion material such as an invar alloy. The pair of radiator main bodies sandwich the low thermal expansion material. However, in the power module of the above publication, since the heat sink is joined to the radiator by screws, the thermal conductivity between the heat sink and the radiator is not high. As a result, heat generated in the heating element is not efficiently radiated.

Japanese Laid-Open Patent Publication No. 2006-294699discloses a heat radiating device of a semiconductor device that efficiently radiates heat generated in a heating element (semiconductor element). The heat radiating device of the above publication includes an insulated substrate and a heat sink. A heating element is mounted on one side of the insulated substrate, and a metal layer and the heat sink are joined to the other side of the insulated substrate. A stress relaxation member is located between the insulated substrate and the heat sink. The stress relaxation member is formed of a material having a high thermal conductivity and has stress absorption spaces. The stress relaxation member has metallic joints joined to the insulated substrate and the heat sink. Thus, the thermal conductivity between the insulated substrate and the heat sink is high. As a result the heat radiating performance for radiating heat generated in the heating element is improved.

In recent years, it has been desired to further improve the thermal conductivity from the heating element to the heat radiating device while reducing thermal stress caused by heat generated in the heating element (semiconductor element).

SUMMARY OF THE INVENTION

Accordingly, it is an objective of the present invention to provide a semiconductor device that has a superior stress relaxation function while improving the thermal conductivity from a semiconductor element to a heat radiating device.

To achieve the foregoing objective and in accordance with one aspect of the present invention, a semiconductor device having a circuit board, a semiconductor element, a heat radiating device, and a junction member is provided. The circuit board includes an insulated substrate, a first metal plate, which is joined to one side of the insulated substrate, and a second metal plate, which is joined to the other side of the insulated substrate. The semiconductor element is joined to the first metal plate. The heat radiating device radiates heat generated by the semiconductor element. The junction member thermally joins the heat radiating device to the second metal plate. The junction member is formed of a material having a high thermal conductivity, and includes recesses, which curve inward from a peripheral portion of the junction member to form stress relaxation spaces at the peripheral portion.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF THE PREFERRED EMBODIMENTS

Figure 1:
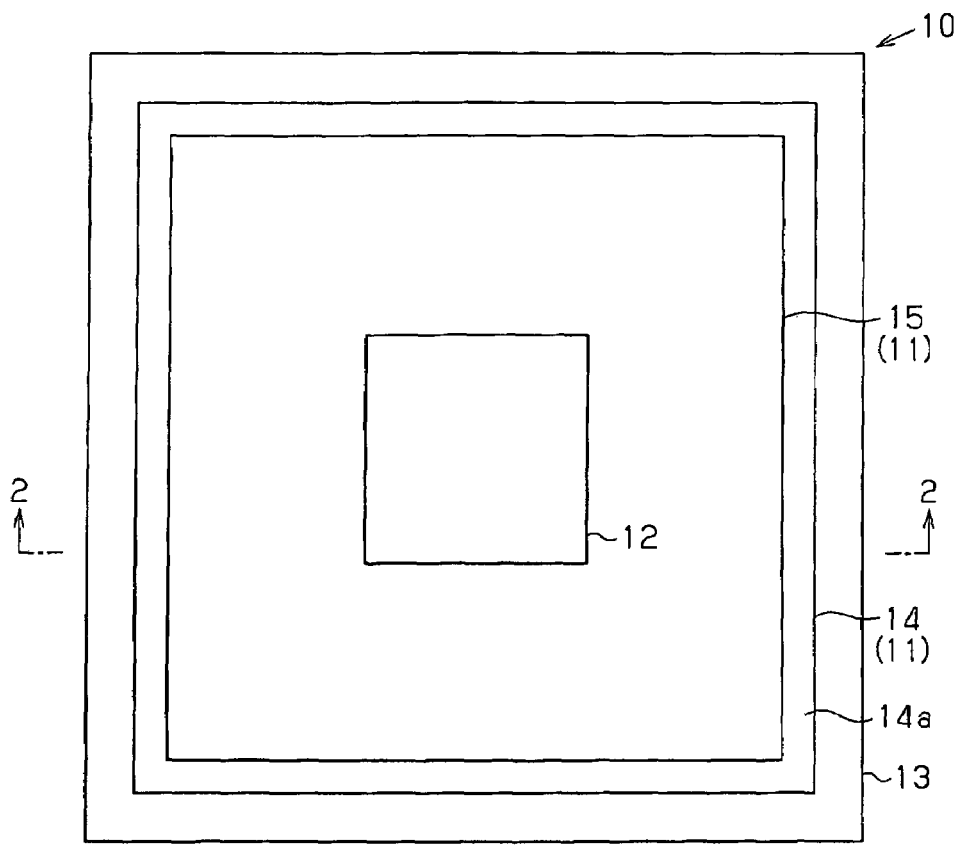
FIG. 1 is plan view showing a semiconductor device according to one embodiment of the present invention.
Figure 2:
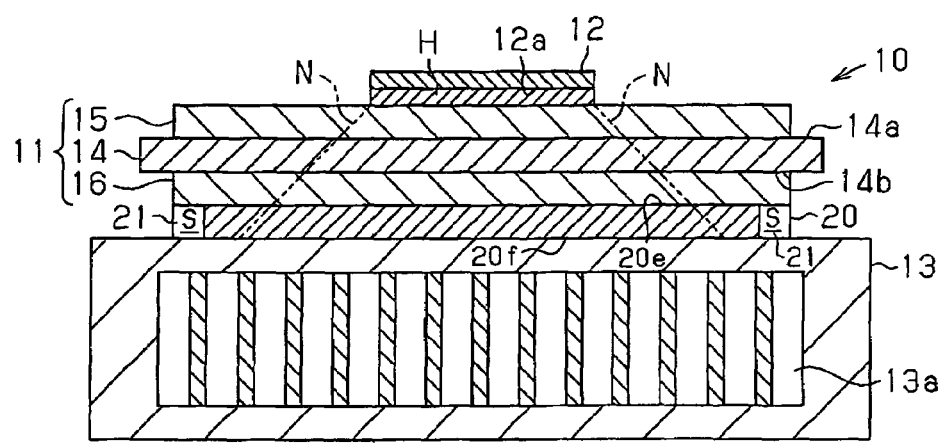
FIG. 2 is a cross-sectional view taken along line 2-2 of FIG. 1.
Figure 3:
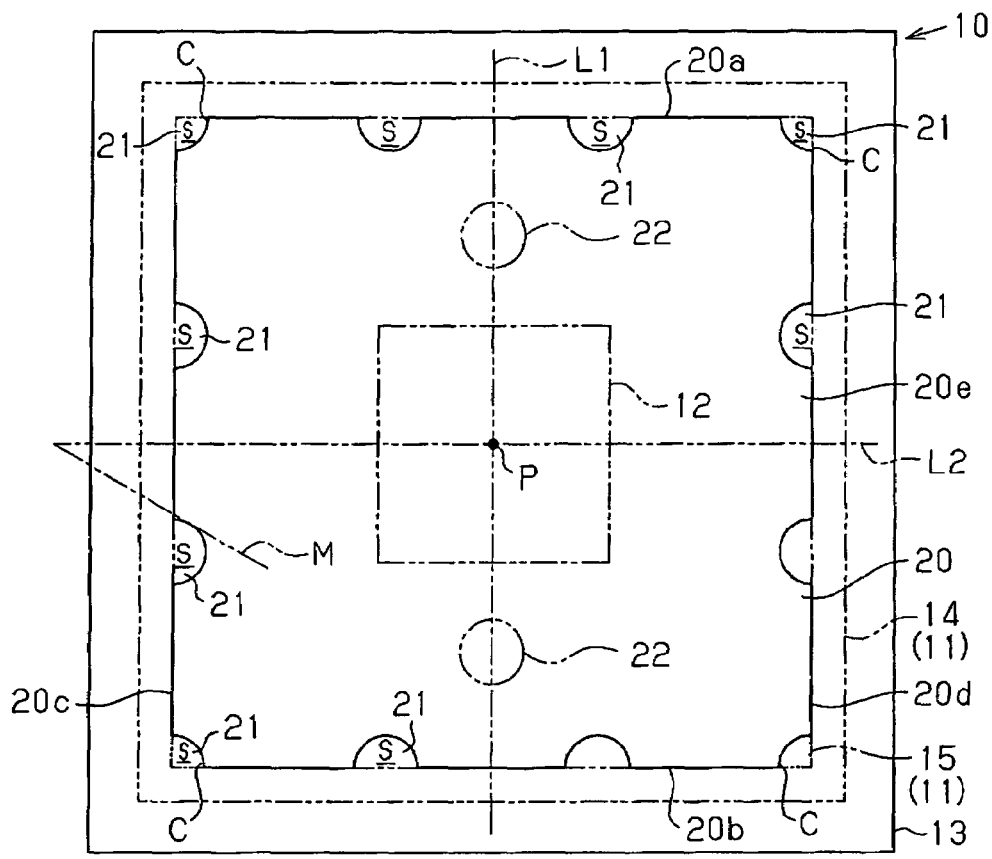
FIG. 3 is a plan view showing a stress relaxation member in the semiconductor device shown in FIG. 2.

A semiconductor device 10 according to one embodiment of the present invention will now be described with reference to FIGS. 1 to 3. The semiconductor device 10 is mounted on, for example, a vehicle, and is applied to a control device for controlling power supplied to an electric motor mounted on the vehicle in accordance with the operating state of the vehicle. Each of the FIGS. 1 to 3 schematically shows the structure of the semiconductor device 10. For the illustrative purposes, the dimensions of some of the elements are exaggerated. That is, the ratios of the widths, lengths, and thicknesses of some of the elements of the semiconductor device 10 in the drawings are not to scale.

As shown in FIG. 2, the semiconductor device 10 includes a circuit board 11, a semiconductor element 12, and a heat sink 13 functioning as a heat radiating device. The semiconductor element 12 is joined (soldered) to the circuit board 11. The heat sink 13 is thermally joined to the circuit board 11. The circuit board 11 is provided with a rectangular plate-like ceramic substrate (insulated substrate) 14 that has a first surface 14a and a second surface 14b, which is opposite to the first surface 14a. The circuit board 11 also includes a metal circuit (first metal plate) 15 joined to the first surface 14a and a metal plate (second metal plate) 16 joined to the second surface 14b.

The ceramic substrate 14 is formed of, for example, aluminum nitride, alumina, or silicon nitride. The metal circuit 15 and the metal plate 16 are formed of aluminum-based metal. The heat sink 13 is formed of aluminum-based metal. The aluminum-based metal refers to pure aluminum or aluminum alloy. The metal circuit 15, the metal plate 16, and the heat sink 13 may be formed of a material having a high thermal conductivity other than the aluminum-based metal, such as copper, a copper alloy, and the like.

As shown in FIG. 1, the semiconductor element 12 is rectangular when viewed from above. The semiconductor element 12 has a junction section 12a facing the metal circuit 15. The junction section 12a is joined to the metal circuit 15 by a solder layer H (see FIG. 2). The semiconductor element 12 is thermally joined to the first surface 14a of the ceramic substrate 14 via the metal circuit 15. One semiconductor element 12 is joined to one metal circuit 15. The semiconductor element 12 is one of an IGBT (Insulated Gate Bipolar Transistor), a MOSFET, and a diode.

As shown in FIG. 2, the heat sink 13 includes passages 13a, through which fluid (for example, cooling water) flows. A stress relaxation member 20 is provided between the heat sink 13 and the metal plate 16 of the circuit board 11. The stress relaxation member 20 functions as a junction member forming a junction portion between the circuit board 11 and the heat sink 13. The stress relaxation member 20 is formed of a material having a high thermal conductivity such as aluminum. As shown in FIG. 3, the stress relaxation member 20 is shaped like a substantially rectangular flat plate when viewed from above. A first surface 20e of the stress relaxation member 20 facing the junction section 12a of the semiconductor element 12 is entirely brazed to the metal plate 16 with a braze material and a second surface 20f opposite to the first surface 20e is entirely brazed to the heat sink 13 with a braze material. That is, junction portions (not shown) made of the braze material are formed between the stress relaxation member 20 and the metal plate 16 and between the stress relaxation member 20 and the heat sink 13. Thus, the circuit board 11 and the heat sink 13 are thermally coupled to each other via the stress relaxation member 20. Heat generated in the semiconductor element 12 is conducted to the heat sink 13 via the circuit board 11 and the stress relaxation member 20.

The structure of the stress relaxation member 20 will now be described in detail. FIG. 3 is a plan view of the semiconductor device 10. In FIG. 3, to facilitate illustration of the stress relaxation member 20, the circuit board 11 and the semiconductor element 12 are drawn by chain double-dashed lines. Also, as shown in FIG. 3, the stress relaxation member 20 has a first side edge 20a and a second side edge 20b, which are upper and lower side edges facing each other, and a third side edge 20c and a fourth side edge 20d, which are left and right side edges facing each other. The first to fourth side edges 20a to 20d and four corners C form a peripheral portion of the stress relaxation member 20. Recesses 21, which curve inward of the stress relaxation member 20, are formed at the four corners C. Each of the first to fourth side edges 20a to 20d has two recesses 21, which curve inward of the stress relaxation member 20.

That is, a number of the recesses 21 are formed at the peripheral portion of the stress relaxation member 20. The recesses 21 formed at the corners C are formed by notching the rectangular highly thermal conductive material such that each recess 21 has a sectorial shape when viewed from above. The recesses 21 formed at the first to fourth side edges 20a to 20d are formed by notching the highly thermal conductive material such that each recess 21 has a semicircular shape when viewed from above. The recesses 21 are formed by punching the highly thermal conductive material, which forms the stress relaxation member 20, along the thickness direction of the stress relaxation member 20.

In the present embodiment, the stress relaxation member 20 is a square having fourfold rotational symmetry. The length of the first to fourth side edges 20a to 20d is 30 mm. The planar shape of the metal plate 16 is the same as the planar shape of the stress relaxation member 20 except the recesses 21, and the stress relaxation member 20 and the metal plate 16 have the same size. The recesses 21 formed at the first to fourth side edges 20a to 20d of the stress relaxation member 20 have a semicircular shape, which is half of a circle having a diameter of 2.5 to 3.5 mm. The recesses 21 formed at the corners C have a sectorial shape, which is a quarter of a circle having a diameter of 2.5 to 3.5 mm. If the diameter of the recesses 21 is less than 2.5 mm, the stress relaxation function of the recesses 21 is hindered, and therefore not preferred. If the diameter of the recesses 21 exceeds 3.5 mm, the size of the stress relaxation member 20 is excessively reduced, and therefore not preferred. That is, if the diameter of the recesses 21 exceeds 3.5 mm, the area of the first surface 20e of the stress relaxation member 20 is reduced. As a result, the joining area of the stress relaxation member 20 to the circuit board 11 (metal plate 16) becomes too small. Furthermore, the area of the second surface 20f of the stress relaxation member 20 is reduced, thereby excessively reducing the joining area of the stress relaxation member 20 to the heat sink 13. As a result, the conductive area of the stress relaxation member 20, which conducts heat generated in the semiconductor element 12, is excessively reduced, which hinders heat conduction to the heat sink 13.

A tangent M that extends through any point on a contour of a section of the highly thermal conductive material defining each recess 21 passes through the stress relaxation member 20. This is because the recesses 21 are formed by notching the highly thermal conductive material inward from its edge. The planar shape of the highly thermal conductive material before the recesses 21 are formed is the same as the planar shape of the metal plate 16. Thus, the side edges 20a to 20d of the stress relaxation member 20 other than the recesses 21 match the side edges of the metal plate 16. Therefore, as shown in FIG. 2, the recesses 21 of the stress relaxation member 20 are located directly below the metal plate 16 and directly above the heat sink 13. Thus, the recesses 21 form stress relaxation spaces S between the metal plate 16 and the heat sink 13.

As shown in FIG. 3, an imaginary line that bisects the distance between the first side edge 20a and the second side edge 20b of the stress relaxation member 20 is assumed to be a reference line L2, which serves as a predetermined reference position of the stress relaxation member 20. The two recesses 21 formed on the first side edge 20a and the two recesses 21 formed on the second side edge 20b are arranged so as to be symmetrical relative to the reference line L2. Also, an imaginary line that bisects the distance between the third side edge 20c and the fourth side edge 20d is assumed to be a reference line L1, which serves as a predetermined reference position of the stress relaxation member 20. The two recesses 21 formed on the third side edge 20c and the two recesses 21 formed on the fourth side edge 20d are arranged so as to be symmetrical relative to the reference line L1. The two recesses formed on each of the first and second side edges 20a, 20b are symmetrical relative to the reference line L1. The two recesses formed on each of the third and fourth side edges 20c, 20d are symmetrical relative to the reference line L2.

Furthermore, the intersecting point of the reference lines L1, L2 on the stress relaxation member 20 is assumed to be a reference point P, which serves as a predetermined reference position of the stress relaxation member 20. The recesses 21 formed on the first side edge 20a and the recesses 21 formed on the second side edge 20b, and the recesses 21 formed on the third side edge 20c and the recesses 21 formed on the fourth side edges 20d are arranged so as to be symmetrical (two-fold rotational symmetry and four-fold rotational symmetry) relative to the reference point P. The recesses 21 of the first to fourth side edges 20a to 20d are formed at positions and into shapes so as to have rotational symmetry.

As shown in FIG. 2, heat generated in the semiconductor device 10 is conducted from the lower surface (junction section 12a) of the semiconductor element 12 to the heat sink 13 through a heat transfer passage, which is a trapezoidal column defined by four inclined surfaces N. The inclined surfaces N extend from the four sides of the lower surface of the semiconductor element 12 (more specifically, the lower surface of the solder layer H), and the angle between the upper surface of the heat sink 13 and the inclined surfaces N is 45°. A straight line (inclined surfaces N) shown by a chain double-dashed line represents the boundary of the heat transfer passage. The notching depth of the recesses 21 of the stress relaxation member 20 is set such that the recesses 21 are not located in the heat transfer passage defined by the inclined surfaces N.

When the semiconductor element 12 mounted on such a semiconductor device 10 is actuated, heat is generated from the semiconductor element 12. The heat generated in the semiconductor element 12 is conducted to the heat sink 13 through the solder layer H, the metal circuit 15, the ceramic substrate 14, the metal plate 16, and the stress relaxation member 20.

Since the stress relaxation member 20 is formed of a material having a high thermal conductivity, the thermal conductivity between the circuit board 11 (metal plate 16) and the heat sink 13 is high. Thus, the heat radiating performance of the semiconductor device 10 is improved. Also, the entire first surface 20e of the stress relaxation member 20 is joined to the metal plate 16, and the recesses 21 are formed only at the peripheral portion of the stress relaxation member 20. Therefore, the heat conducted through the circuit board 11 is entirely conducted to the stress relaxation member 20, and the heat transfer area of the stress relaxation member 20 is sufficiently secured. As a result, the heat conducted from the circuit board 11 is efficiently conducted to the heat sink 13.

The heat conducted to the heat sink 13 is then conducted to the fluid flowing through the passages 13a in the heat sink 13, and removed. That is, since the heat sink 13 is forcibly cooled by the fluid flowing through the passages 13a, the heat generated in the semiconductor element 12 is efficiently removed. As a result, the semiconductor element 12 is cooled from the section closer to the junction section 12a.

When the heat generated in the semiconductor element 12 is conducted to the heat sink 13, the ceramic substrate 14 and the heat sink 13 are heated, and the ceramic substrate 14 and the heat sink 13 are expanded. When the semiconductor element 12 stops generating heat, the temperature of the ceramic substrate 14 and the heat sink 13 is lowered, and the ceramic substrate 14 and the heat sink 13 are shrunk. At thermal expansion and thermal shrinkage, thermal stress is generated in the semiconductor device 10 due to the difference in the coefficient of linear expansion between the ceramic substrate 14 and the heat sink 13.

The semiconductor device 10 of the present embodiment has the stress relaxing spaces S formed by the recesses 21 at the peripheral portion of the stress relaxation member 20 (the corners C and the first to fourth side edges 20a to 20d). Thus, when the thermal stress is generated, the stress relaxing spaces S absorb deformation of the stress relaxation member 20, and the thermal stress is relaxed accordingly.

The thermal stress concentrates at the peripheral portion of the stress relaxation member 20. The recesses 21 of the stress relaxation member 20 are located at positions where the thermal stress is the greatest, such as the corners C of the stress relaxation member 20, and positions where the thermal stress is the second greatest next to the corners C, which positions are the first to fourth side edges 20a to 20d. Since the recesses 21 absorb great deformation of the stress relaxation member 20, the thermal stress is reliably relaxed.

This embodiment provides the following advantages.

(1) The recesses 21 are notched in the peripheral portion of the stress relaxation member 20, which forms the junction portion between the circuit board 11 and the heat sink 13. The thermal stress generated in the semiconductor device 10 is greater at the peripheral portion than at the inner section of the stress relaxation member 20. Since the recesses 21 are formed at the peripheral portion where the thermal stress is great, the thermal stress is efficiently relaxed, and the stress relaxation member 20 exerts a superior stress relaxing function. This prevents cracks from being generated, by the thermal stress, in the junction portions (braze material) between the stress relaxation member 20 and the metal plate 16 and between the stress relaxation member 20 and the heat sink 13. Furthermore, warps are prevented from being generated in the heat sink 13. Since the stress relaxation member 20 is formed of a material having a high thermal conductivity, and the recesses 21 are formed at the peripheral portion of the stress relaxation member 20, the heat transfer area of the stress relaxation member 20 is sufficiently secured. Thus, heat conduction performance between the circuit board 11 (metal plate 16) and the heat sink 13 via the stress relaxation member 20 is improved, which improves the heat radiating performance of the semiconductor device 10.

(2) The recesses 21 are formed at all the corners C of the stress relaxation member 20. Since the corners C of the stress relaxation member 20 are sections at which the greatest thermal stress acts among the sections of the peripheral portion of the stress relaxation member 20, the thermal stress that acts on the stress relaxation member 20 is efficiently relaxed.

(3) The recesses 21 are formed in the first to fourth side edges 20a to 20d, which form the stress relaxation member 20. Since the first to fourth side edges 20a to 20d of the stress relaxation member 20 are sections to which the second greatest thermal stress acts next to the corners C, the thermal stress acting on the stress relaxation member 20 is efficiently relaxed.

(4) The entire section of the first surface 20e of the stress relaxation member 20 located directly below the junction section 12a of the semiconductor element 12 is joined to the metal plate 16. The heat generated in the semiconductor element 12 is conducted from the junction section 12a of the semiconductor element 12 to the heat sink 13 via the circuit board 11 and the stress relaxation member 20. At the junction portion between the metal plate 16 and the stress relaxation member 20, there is no region (non-junction region) in the stress relaxation member 20 that does not join the metal plate 16. Thus, the thermal conductivity of the section from the circuit board 11 to the heat sink 13 is higher as compared to a case where the non-junction region exists. Therefore, in the present embodiment, although the joining area of the stress relaxation member 20 to the metal plate 16 is reduced by the recesses 21, the thermal conductivity of the section from the circuit board 11 to the heat sink 13 is improved. Thus, the semiconductor device 10 exerts superior stress relaxation function while exerting superior thermal conductivity.

(5) The recesses 21 are arranged so as to be symmetrical relative to the reference line L1 or the reference line L2 and to have rotational symmetry (point symmetry) relative to the reference point P. Thus, imbalance of relaxation of the thermal stress at the peripheral portion of the stress relaxation member 20, that is, local concentration of the thermal stress is avoided to reduce the maximum value of the thermal stress.

(6) The recesses 21 are formed by pressing the peripheral portion of the highly thermal conductive material, which forms the stress relaxation member 20. Thus, for example, as compared to a case where the highly thermal conductive material is etched or a case where the recesses 21 are formed at the inner section of the high thermal conductive material, the recesses 21 are easily formed.

The above embodiment may be modified as follows.

Figure 4:
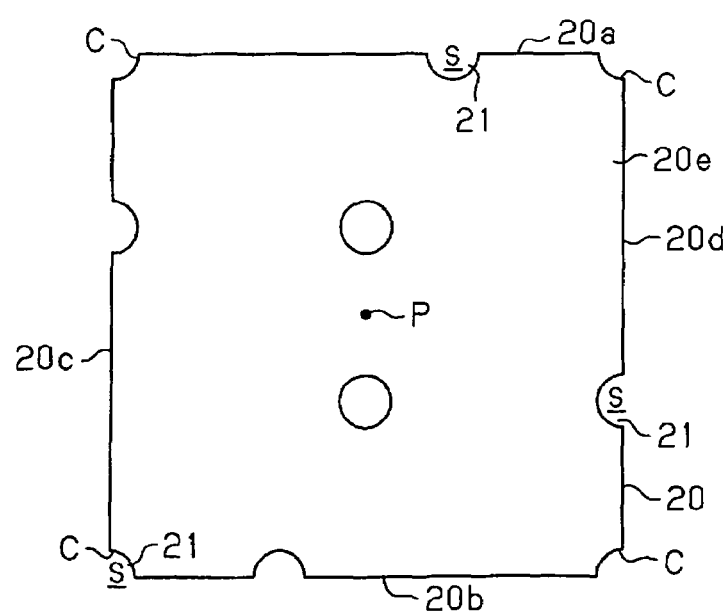
FIG. 4 is a plan view showing a stress relaxation member according to a modified embodiment.

As shown in FIG. 4, only one recess 21 may be formed in each of the first to fourth side edges 20a to 20d of the stress relaxation member 20. In this case, the recess 21 formed at the first side edge 20a and the recess 21 formed at the second side edge 20b are arranged to be symmetrical relative to the reference point P, and the recess 21 formed at the third side edge 20c and the recess 21 formed at the fourth side edge 20d are arranged to be symmetrical relative to the reference point P.

As shown by a chain double-dashed line in FIG. 3, in addition to the recesses 21 formed at the peripheral portion, through holes 22 extending through the stress relaxation member 20 may be formed at the inner section of the stress relaxation member 20. Also, recesses having a depth less than the thickness of the stress relaxation member 20 may be formed instead of the through holes 22.

Figure 5:
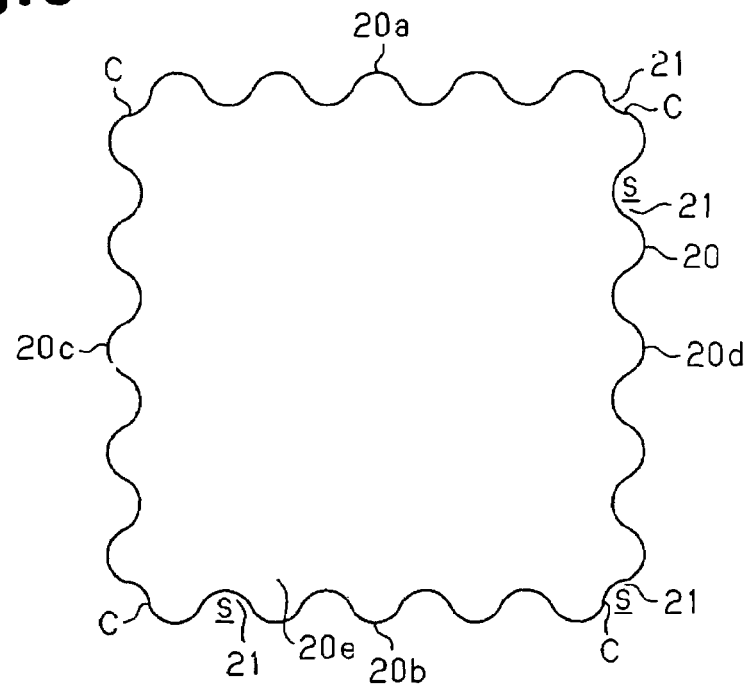
FIG. 5 is a plan view showing a stress relaxation member according to another modified embodiment.

As shown in FIG. 5, the first to fourth side edges 20a to 20d may be corrugated so that each recess 21 is formed between the adjacent ridges. In this case, the recesses 21 are preferably formed at all the corners C of the stress relaxation member 20. When the first to fourth side edges 20a to 20d are corrugated, the distal end of the ridges may be made sharp, or the depth of the recesses 21 (or the diameter of the recesses 21) may be changed as required.

Figure 6:
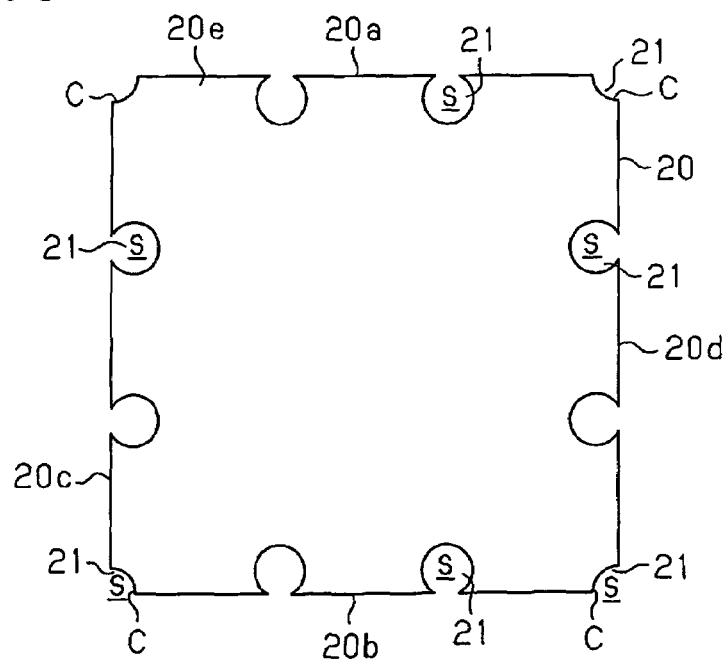
FIG. 6 is a plan view showing a stress relaxation member according to a further modified embodiment.

As shown in FIG. 6, the planar shape of the recesses 21 formed in the first to fourth side edges 20a to 20d may be a major arc, that is, the recesses 21 may have a sectorial shape with a central angle of more than 180°. The planar shape of the recesses 21 formed in the first to fourth side edges 20a to 20d may be an elliptic shape, a rhombic shape, a triangular shape, a long hole shape, or may be changed as required.

The number of recesses 21 arranged in each of the first to fourth side edges 20a to 20d may be changed as required in accordance with the heat generating state of the semiconductor element 12 attributed to the size, position, and the number of semiconductor elements 12 on the circuit board 11.

The recesses 21 may be formed in one, two, or three of the first to fourth side edges 20a to 20d. Alternatively, the recesses 21 may be concentrated at any position of the side edges 20a to 20d.

The recesses 21 may be formed at one, two, or three of the four corners C.

The metal plate 16 of the circuit board 11 may be regarded as part of the junction member, and recesses may be formed at the peripheral portion of the metal plate 16 and the stress relaxation member 20 (at least at the corners among the corners and side edges). The recesses may be formed in the metal plate 16 by etching the metal plate 16.

Recesses may be formed in the metal plate 16, and the metal plate 16 may be directly joined with the heat sink 13 without the stress relaxation member 20.

The fluid flowing through the passages 13a need not be water as long as the heat sink 13 is a cooler that is forcibly cooled. For example, liquid other than water or gas such as air may be used. The heat sink 13 may also be a boiling cooler.

The metal circuit 15 formed on the circuit board 11 need not be one, and two or more metal circuits 15 may be formed. Also, two or more semiconductor elements 12 may be joined on one metal circuit 15.

The semiconductor device 10 need not be installed on vehicles but may be applied to other uses.

What is claimed is:

1. A semiconductor device comprising:
a circuit board including an insulated substrate, a first metal plate, which is joined to one side of the insulated substrate, and a second metal plate, which is joined to the other side of the insulated substrate;
a semiconductor element joined to the first metal plate;
a heat radiating device, which radiates heat generated by the semiconductor element; and
a junction member, which thermally joins the heat radiating device to the second metal plate,
wherein the junction member is formed of a material having a high thermal conductivity, and includes recesses, which curve inward from a peripheral portion of the junction member to form stress relaxation spaces at the peripheral portion.

2. The device according to claim 1, wherein the junction member has a polygonal shape when viewed from above, and the recesses are formed at corners of the junction member.

3. The device according to claim 2, wherein the recesses are formed at a side edge of the junction member.

4. The device according to claim 1, wherein the junction member includes a first surface facing the semiconductor element and a second surface joined to the heat radiating device, and the entire first surface is joined to the second metal plate.

5. The device according to claim 1, wherein the recesses are arranged to be symmetrical relative to a predetermined reference position on the junction member.

6. The device according to claim 5, wherein the recesses are arranged to be symmetrical relative to a predetermined reference line on the junction member, and to be symmetrical relative to a predetermined reference point on the junction member.

7. The device according to claim 1, wherein the recesses are arcuate.

* * * * *